(12) United States Patent
Zou et al.

(10) Patent No.: US 9,159,938 B2
(45) Date of Patent: Oct. 13, 2015

(54) THIN FILM TRANSISTOR

(71) Applicants: Tsinghua University, Beijing (CN); HON HAI PRECISION INDUSTRY CO., LTD., New Taipei (TW)

(72) Inventors: Yuan Zou, Beijing (CN); Qun-Qing Li, Beijing (CN); Jun-Ku Liu, Beijing (CN); Zhen-Dong Zhu, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/011,918

(22) Filed: Aug. 28, 2013

(65) Prior Publication Data
US 2014/0291614 A1 Oct. 2, 2014

(30) Foreign Application Priority Data

Apr. 2, 2013 (CN) .......................... 2013 1 0112449

(51) Int. Cl.
H01L 51/05 (2006.01)
H01L 51/00 (2006.01)
H01L 21/02 (2006.01)

(52) U.S. Cl.
CPC ........ H01L 51/0529 (2013.01); H01L 21/0231 (2013.01); H01L 21/02134 (2013.01); H01L 21/02282 (2013.01); H01L 51/0002 (2013.01); H01L 51/0558 (2013.01); H01L 51/0048 (2013.01); H01L 51/0525 (2013.01); H01L 51/0541 (2013.01); H01L 51/0545 (2013.01)

(58) Field of Classification Search
CPC ..... H01L 51/00; H01L 51/0003; H01L 51/05; H01L 51/0048; H01L 51/0558
See application file for complete search history.

(56) References Cited

U.S. PATENT DOCUMENTS

2006/0234430 A1* 10/2006 Liu et al. ...................... 438/149
2010/0252806 A1* 10/2010 Choi et al. ...................... 257/13
2011/0037124 A1* 2/2011 Liu et al. ...................... 257/348
2011/0048930 A1* 3/2011 Babich et al. ............. 204/192.34

OTHER PUBLICATIONS

Joel Yang, "Fabrication of Superconducting Nanowire Single Photon Detectors", 2005, MIT, pp. 49-52 <http://dspace.mit.edu/handle/1721.1/34355>.*
A E Grigorescu and C W Hagen, "Resists for sub-20-nm electron beam lithography with a focus on HSQ: state of the art", 2009, IOP Publishing, Nanotechnology 20 292001, p. 18 <http://iopscience.iop.org/0957-4484/20/29/292001>.*
Chang-Chang Yang and Wen-Chang Chen, "The structures and properties of hydrogen silsesquioxane (HSQ) films produced by thermal curing", 2002, Journal of Materials Chemistry <http://pubs.rsc.org/en/Content/ArticleLanding/2002/JM/b107697n#!divAbstract>.*

* cited by examiner

Primary Examiner — Peniel M Gumedzoe
(74) Attorney, Agent, or Firm — Novak Druce Connolly Bove + Quigg LLP

(57) ABSTRACT

A thin film transistor is provided. The thin film transistor includes a source electrode, a drain electrode, a semiconducting layer, a transition layer, an insulating layer and a gate electrode. The drain electrode is spaced apart from the source electrode. The gate electrode is insulated from the source electrode, the drain electrode, and the semiconductor layer by the insulating layer. The transition layer is sandwiched between the insulating layer and the semiconductor layer. The transition layer is a silicon-oxide cross-linked polymer layer including a plurality of Si atoms. The plurality of Si atoms is bonded with atoms of the insulating layer and atoms of the semiconductor layer.

11 Claims, 5 Drawing Sheets

THIN FILM TRANSISTOR

This application claims all benefits accruing under 35 U.S.C. §119 from China Patent Application No. 201310112449.2, filed on Apr. 2, 2013 in the China Intellectual Property Office, the contents of which are hereby incorporated by reference.

BACKGROUND

1. Technical Field

The present invention relates to thin film transistors and, particularly, to a carbon nanotube based thin film transistor.

2. Description of Related Art

A typical thin film transistor (TFT) is made of a substrate, a gate electrode, an insulation layer, a drain electrode, a source electrode, and a semiconducting layer. The thin film transistor performs a switching operation by modulating an amount of carriers accumulated in an interface between the insulation layer and the semiconductor layer from an accumulation state to a depletion state, with applied voltage to the gate electrode, to change an amount of the current passing between the drain electrode and the source electrode.

State of interface between the insulation layer and the semiconductor layer has a great effect to the property of thin film transistor. For example, water molecule, hydroxyl free radical, and oxygen free radical existing between the insulation layer and the semiconductor layer will affect the state of interface, reducing on/off ratio of current and electron mobility, thereby destroying the stability of thin film transistor.

What is needed, therefore, is a thin film transistor that can overcome the above-described shortcomings.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
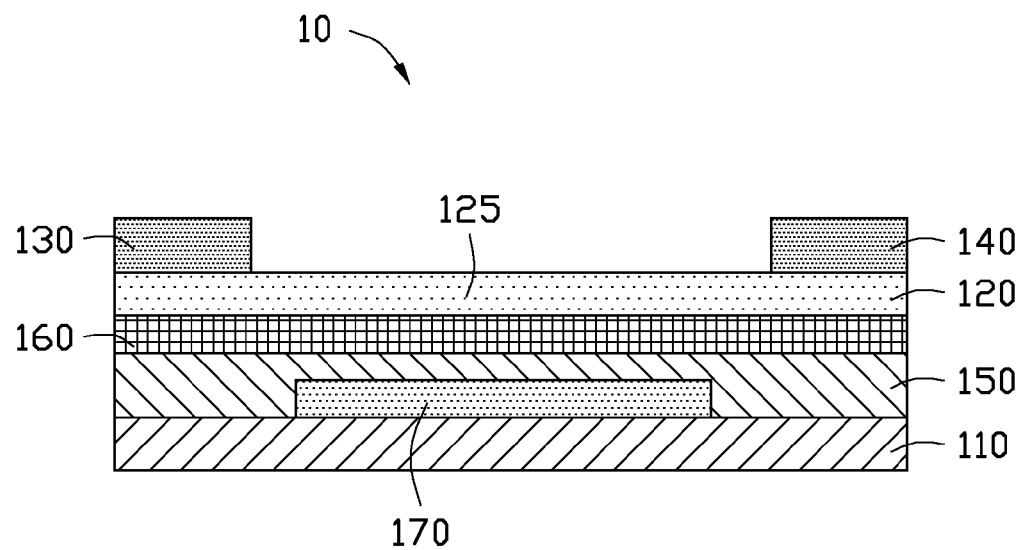
FIG. 1 is a cross sectional view of one embodiment of a thin film transistor.

Referring to FIG. 1, a thin film transistor 10 of one embodiment includes a semiconductor layer 120, a source electrode 130, a drain electrode 140, an insulating layer 150, a transition layer 160, and a gate electrode 170. The thin film transistor 10 is positioned on a surface of an insulating substrate 110. The source electrode 130 and the drain electrode 140 are spaced from each other. The semiconductor layer 120 is electrically connected to the source electrode 130 and the drain electrode 140. The gate electrode 170 is insulated from the semiconductor layer 120, the source electrode 130, and the drain electrode 140 through the insulating layer 150. The transition layer 160 is sandwiched between the semiconductor layer 120 and the insulating layer 150.

The thin film transistor 10 can be a bottom gate structure. In detail, the gate electrode 170 is located on the insulating substrate 110. The insulating layer 150 covers the gate electrode 170, and a part of the insulating layer 150 is directly located on the insulating substrate 110. The transition layer 160 is located on a surface of the insulating layer 150 away from the gate electrode 170. The semiconductor layer 120 is located on a surface of the transition layer 160 away from the insulating layer 150. That is, two opposite surfaces of the transition layer 160 contact the semiconductor layer 120 and the insulating layer 150 directly. The source electrode 130 and the drain electrode 140 are located on a surface of the semiconductor layer 120. A channel 125 is defined as a part of the semiconductor layer 120 between the source electrode 130 and the drain electrode 140.

The insulating substrate 110 is provided for supporting the thin film transistors 10. The material of the insulating substrate 110 can be the same as a substrate of a printed circuit board (PCB), and can be rigid materials (e.g., p-type or n-type silicon, silicon with an silicon dioxide layer formed thereon, crystal, crystal with a oxide layer formed thereon), or flexible materials (e.g., plastic or resin). In one embodiment, the material of the insulating substrate is glass. The shape and size of the insulating substrate 110 is arbitrary. The plurality of thin film transistors 10 can be located on the insulating substrate 110 in a predetermined order.

The semiconductor layer 120 can include carbon nanotube, inorganic semiconductor material, such as GaN, GaAs, SiN, SiC, CdTe, HgTe, GeSi, InZnO, InGaO, and HfZnSnO, or organic semiconductor material, such as perylenetetracarboxylic dianhydride (PTCDA), naphthalic tetracarboxylic dianhydride (NTCDA). In one embodiment, the semiconductor layer 120 can include a carbon nanotube layer. The length of the semiconductor layer 120 ranges from about 1 micrometer to about 1 millimeter. The width of the semiconductor layer 120 ranges from about 1 micrometer to about 1 millimeter. The thickness of the semiconductor layer 120 ranges from about 0.5 nanometers to about 100 millimeters.

The carbon nanotube layer includes a plurality of carbon nanotubes. The carbon nanotubes are single-walled carbon nanotubes. The carbon nanotube layer can consist of a plurality of semi-conductive carbon nanotubes obtained via chemical separating method. The carbon nanotube layer can be composed of a combination of semi-conductive and metallic carbon nanotubes obtained via chemical vapor deposition. The ratio of semi-conductive and metallic of carbon nanotubes is 2:1. The carbon nanotube layer has good semi-conductive property. A diameter of the carbon nanotubes is smaller than 5 nanometers. In one embodiment, the diameter of the carbon nanotubes is smaller than 2 nanometers.

The carbon nanotube layer can include at least one carbon nanotube. The carbon nanotube is a single-walled carbon nanotube with a long length. When the carbon nanotube layer includes a plurality of carbon nanotube, the plurality of carbon nanotubes is paralleled with the insulating substrate 110. The length of carbon nanotubes is greater than 5 micrometers. A part of the plurality of carbon nanotubes includes a first end and a second end opposite to the first end. The first end is electrically connected to the source electrode 130, and the second end is electrically connected to the drain electrode 140. The plurality of carbon nanotubes has good semi-conductive property. In one embodiment, the length of carbon nanotubes is greater than 10 micrometers. The plurality of carbon nanotubes can intersect with each other to form a network, and the plurality of carbon nanotubes can also be parallel with each other. In one embodiment, the plurality of carbon nanotubes is parallel with each other and extends along a direction from the source electrode 130 to the drain electrode 140. The plurality of carbon nanotubes is spaced from each other. A distance between adjacent two carbon nanotubes ranges from about 0 micrometers to about 100 micrometers. The first end of the plurality of carbon nanotubes is electrically connected to the source electrode 130, and the second end of the plurality of carbon nanotubes is electrically connected to the drain electrode 140.

The carbon nanotube layer can include a disordered carbon nanotube film. The carbon nanotube film includes a plurality of carbon nanotubes joined by van der Waals attractive force. In the disordered carbon nanotube film, the carbon nanotubes are disordered. The term 'disordered' is defined as the carbon nanotubes are arranged along many different directions, and the aligning directions of the carbon nanotubes are random. The number of the carbon nanotubes arranged along each different direction can be almost the same (e.g. uniformly disordered). The disordered carbon nanotubes can be isotropic. The disordered carbon nanotubes entangle with each other to form the disordered carbon nanotube film, and a plurality of apertures is defined by the carbon nanotubes. A diameter of the aperture can smaller than 50 micrometers. The plurality of the apertures can enhance the transparence of the carbon nanotube film. The disordered carbon nanotube film can be isotropic. The thickness of the carbon nanotubes layer is in a range from about 0.5 nanometers to about 100 micrometers. The diameter of carbon nanotubes of the carbon nanotubes layer is small than 5 nanometers. The length of carbon nanotubes of the carbon nanotubes layer ranges from about 100 nanometers to about 1 millimeter. In one embodiment, the diameter of carbon nanotubes is small than 2 nanometers and the length of carbon nanotubes ranges from about 1 micrometer to about 1 millimeter.

In one embodiment, the semiconductor layer 120 includes a plurality of carbon nanotubes parallel with each other, the diameter of the carbon nanotubes is about 5 nanometers, and the length of the carbon nanotubes is about 30 micrometers.

The material of the insulating layer 150 can be a rigid material such as aluminum oxide ($Al_2O_3$), silicon nitride ($Si_3N_4$), silicon dioxide ($SiO_2$), hafnium oxide ($HfO_2$), or a flexible material such as polyethylene terephthalate (PET), benzocyclobutenes (BCB), polyester or acrylic resins. A thickness of the insulating layer 150 can be in a range from about 10 nanometers to about 100 micrometers. In one embodiment, the material of the insulating layer 150 is $HfO_2$, the thickness of the insulating layer 150 is about 40 nanometers.

Figure 2:
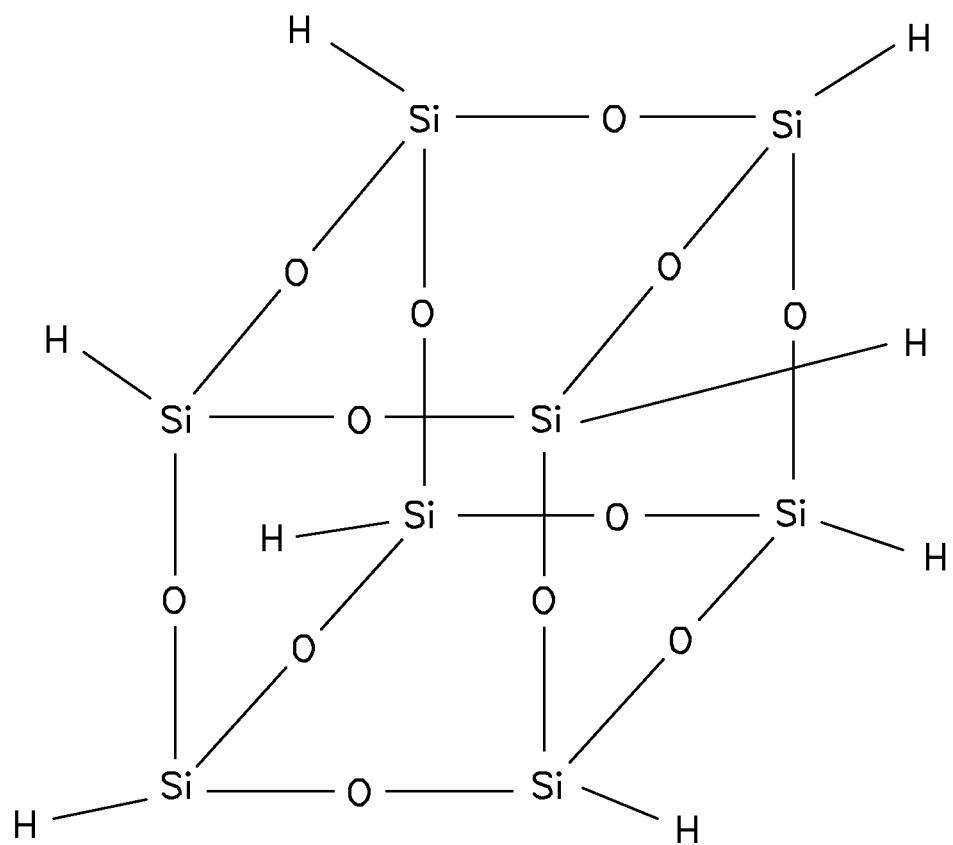
FIG. 2 is a schematic view of a box-like unit of hydrogen silsesquioxane (HSQ).
Figure 3:
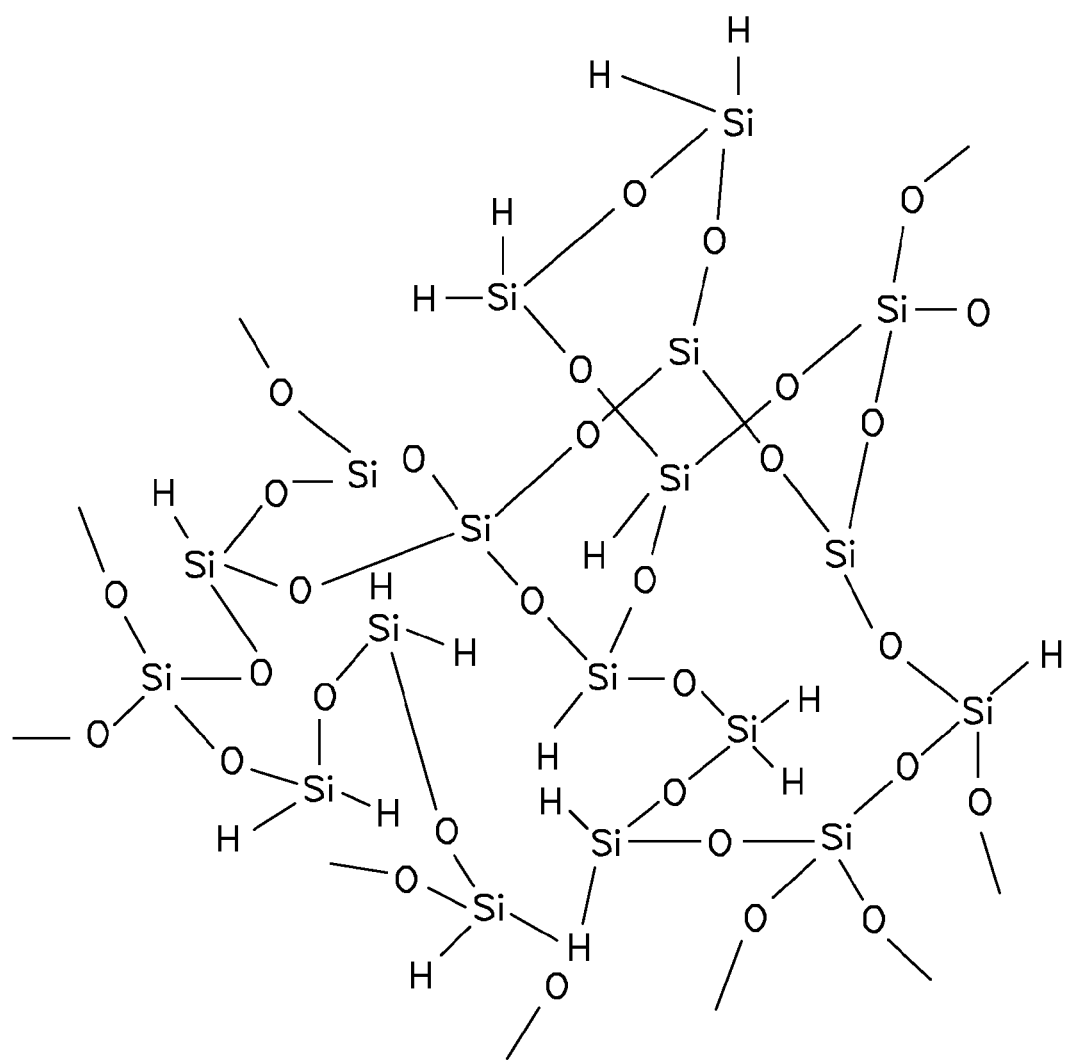
FIG. 3 is a schematic view of silicon-oxide cross-linked polymer.

The transition layer 160 includes a silicon-oxide cross-linked polymer layer. The silicon-oxide cross-linked polymer layer is obtained by curing a hydrogen silsesquioxane (HSQ) gel layer. As shown in FIG. 2, the HSQ includes a plurality of box-like units, and has a structural formula: $(HSiO_{3/2})_{2n}$. The n is natural number. As shown in FIG. 3, the material of the silicon-oxide cross-linked polymer layer is a network of silicon atoms and oxide atoms bonded, and has a structural formula: $Si_xO_yH_z$. The x and y satisfy following formula: x:y=1:1~2:1. The z has a range from about 0.2 to about 0.3. The plurality of box-like units of the HSQ has a plurality of Si—O bonds and a plurality of Si—H bonds. In the process of treating the HSQ gel layer under a high temperature, the plurality of Si—O bonds and the plurality of Si—H bonds break and a plurality of Si atoms with dangling bonds is formed. Part of the plurality of Si atoms with dangling bonds on the surface of the transition layer 160 connects with atoms of the insulating layer 150 and the semiconductor layer 120. The transition layer 160 has a firm contact with the insulating layer 150 and the semiconductor layer 120. Interface states between the transition layer and the semiconductor layer and between the transition layer and the insulating layer are great. The thin film transistor has high on/off ratio of current and electron mobility.

A thickness of the transition layer 160 ranges from about 5 nanometers to about 25 nanometers. In one embodiment, the thickness of the transition layer 160 is about 10 nanometers.

The source electrode 130, the drain electrode 140, and/or the gate electrode 170 are made of conductive material. In one embodiment, the source electrode 130, the drain electrode 140, and the gate electrode 170 are conductive films. A thickness of the conductive film can be in a range from about 0.5 nanometers to about 100 micrometers. The material of the source electrode 130, the drain electrode 140, and the gate electrode 170 can be selected from the group consisting of metal, alloy, indium tin oxide (ITO), antimony tin oxide (ATO), silver paste, conductive polymer, or metallic carbon nanotubes. The metal or alloy can be aluminum (Al), copper (Cu), tungsten (W), molybdenum (Mo), gold (Au), titanium (Ti), neodymium (Nd), palladium (Pd), cesium (Cs), scandium (Sc), hafnium (Hf), potassium (K), sodium (Na), lithium (Li), nickel (Ni), rhodium (Rh), or platinum (Pt), and combinations of the above-mentioned metal.

In one embodiment, the source electrode 130 and the drain electrode 140 are Cs films, a thickness of the Cs film is about 5 nanometers, the gate electrode 170 is Al film, and a thickness of the Al film is about 5 nanometers.

Figure 4:
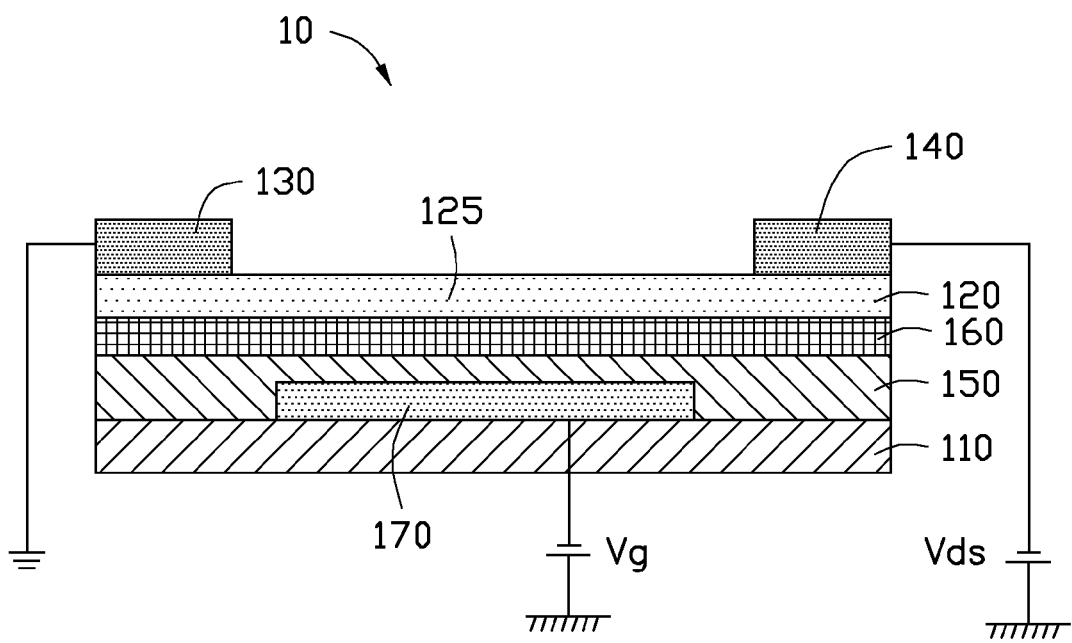
FIG. 4 is a schematic view of the thin film transistor of FIG. 1 connected to a circuit.

Referring to FIG. 4, in use, the source electrode 130 is grounded. A voltage Vds is applied to the drain electrode 140. Another voltage Vg is applied on the gate electrode 170. The voltage Vg forming an electric field in the channel 125 of the semiconducting layer 120. Accordingly, carriers exist in the channel near the gate electrode 170. As the Vg increasing, a current is generated and flows through the channel 125. Thus, the source electrode 130 and the drain electrode 140 are electrically connected.

The thin film transistor has many advantages. The transition layer 160 is the silicon-oxide cross-linked polymer layer. Part of the plurality of Si atoms with dangling bonds on the surface of the transition layer 160 connects with atoms of the insulating layer 150 and the semiconductor layer 120. The transition layer 160 has a firm contact with the insulating layer 150 and the semiconductor layer 120. State of an interface between the transition layer 160 and the insulating layer 150 or the semiconductor layer 120 is great. The thin film transistor has high on/off ratio of current and electron mobility.

A method of making the thin film transistor is further provided. The method includes following steps:

Step (S1), providing an insulating substrate 110 and forming a gate electrode 170 on the insulating substrate 110;

Step (S2), forming an insulating layer 150 on the gate electrode 170;

Step (S3), forming an HSQ gel layer on the insulating layer 150;

Step (S4), pre-baking the HSQ gel layer to form a HSQ pre-layer;

Step (S5), forming a semiconductor layer 120 on the HSQ pre-layer;

Step (S6), baking the HSQ pre-layer to form a transition layer 160, wherein a plurality of Si atoms of the transition layer is bonded with atoms of the insulating layer 150 and atoms of the semiconductor layer 120; and Step (S7), forming a source electrode 130 and a drain electrode 140 spaced from the source electrode 130 on the transition layer 160.

In step (S1), the gate electrode 170 can be formed via evaporating, sputtering, or printing. In one embodiment, the gate electrode 170 is formed on the insulating substrate 110 via evaporating aluminum.

In step (S2), the insulating layer 150 can be formed via evaporating, sputtering, or atom layer depositing. In one embodiment, the insulating layer 150 is formed on a surface of the gate electrode 170 away from the insulating substrate 110 via atom layer deposition, material of the insulating layer 150 is aluminum oxide, and a thickness of the insulating layer 150 is about 40 nanometers.

In step (S3), the HSQ gel layer is formed via spin-coating, spraying, or blade coating. In one embodiment, the forming the HSQ gel layer includes following steps: preparing a HSQ gel via mixing HSQ and a solvent; and forming the HSQ gel layer on a surface of the insulating layer 150 away from the gate electrode 170 via spin-coating. The volume ratio of the HSQ and the solvent ranges from about 1:15 to about 1:25. The solvent is organic solvent, such as methyl isobutyl ketone, or butanone. A thickness of the HSQ gel layer ranges from about 10 nanometers to about 30 nanometers. The thickness of the HSQ gel layer is related with concentration of the HSQ gel. For example, when the volume ratio of the HSQ and the solvent is selected as about 1:15, about 1:20, or about 1:25, the thickness of the HSQ gel layer will be about 10 nanometers, about 20 nanometers, or about 30 nanometers, respectively. In one embodiment, the volume ratio of the HSQ and the solvent is about 1:20 and the thickness of the HSQ gel layer is about 20 nanometers.

In step (S4), part of the solvent of the HSQ gel layer can be volatilized in the pre-baking process to be pre-solidified. A temperature of the pre-baking step ranges from about 80 centigrade to about 110 centigrade. A curing time of the pre-baking step ranges about 30 seconds to about 3 minutes. In one embodiment, the temperature of the pre-baking is about 105 centigrade and the curing time of the pre-baking process is about 2 minutes.

In step (S5), the semiconductor layer 120 can be formed via chemical vapor deposition or chemical separation. In one embodiment, the semiconductor layer 120 includes a plurality of carbon nanotubes parallel with each other is located on the HSQ pre-layer.

In step (S6), the transition layer 160 can be formed via baking the HSQ pre-layer under a high temperature, $O_2$ plasma method, or electron beam exposure method. In one embodiment, the HSQ pre-layer is formed via baking under about 500 centigrade for about 30 minutes. In the process of baking the HSQ pre-layer, the plurality of Si—O bonds and the plurality of Si—H bonds of the plurality of box-like units of HSQ break. A plurality of Si atoms with dangling bonds is formed. Two of the plurality of Si atoms with dangling bonds connects with one of a plurality of O atoms of HSQ to form Si—O—Si bonds and the silicon-oxide cross-linked polymer is obtained. A part of the plurality of Si atoms with dangling bonds on the surface of the transition layer 160 connects with some atoms of the insulating layer 150 or some atoms of the semiconductor layer 120. Then the transition layer 160 has a firmly contact with the insulating layer 150 and the semiconductor layer 120.

In step (S7), the source electrode 130 and the drain electrode 140 can be formed via evaporating, sputtering, or printing. In one embodiment, the source electrode 130 and the drain electrode 140 are formed on the semiconductor layer 120 via evaporating a metal Cs.

Figure 5:
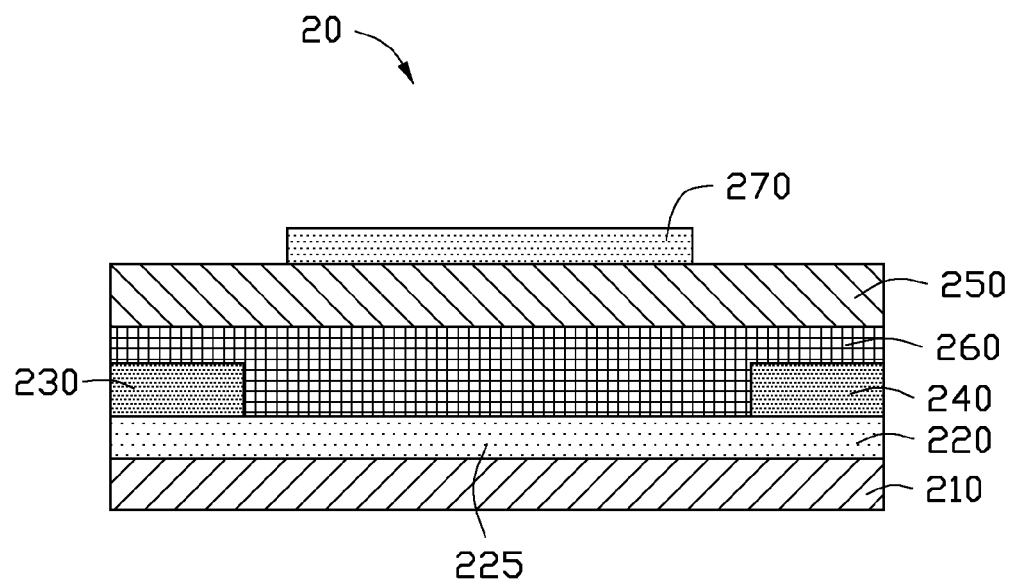
FIG. 5 is a cross sectional view of another embodiment of a thin film transistor.

Referring to FIG. 5, a thin film transistor 20 is provided and has a top gate structure. The thin film transistor 20 includes a semiconductor layer 220, a source electrode 230, a drain electrode 240, an insulating layer 250, a transition layer 260, and a gate electrode 270. The thin film transistor 20 is located on a surface of insulating substrate 210.

The structure of the thin film transistor 20 is similar with that of the thin film transistor 10, except that the thin film transistor 20 has a top gate structure. The semiconductor layer 220 is located on a surface of the insulating substrate 210. The source electrode 230 and the drain electrode 240 are spaced from each other and located on the semiconductor layer 220. The transition layer 260 is located on the semiconductor layer 220 and covers the source electrode 230 and the drain electrode 240. The insulating layer 250 is located on a surface of the transition layer 260 away from the semiconductor layer 220. The gate electrode 270 is located on a surface of the insulating layer 250 away from the transition layer 260.

Depending on the embodiments, certain of the steps described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure.

What is claimed is:

1. A thin film transistor comprising:
    a source electrode;
    a drain electrode spaced from the source electrode;
    a semiconductor layer electrically connected with the source electrode and the drain electrode, the semiconductor layer is a carbon nanotube layer comprising a plurality of semi-conductive carbon nanotubes and a plurality of metallic carbon nanotubes, and a ratio of the plurality of semi-conductive carbon nanotubes and the plurality of metallic carbon nanotubes is about 2:1; and
    a gate electrode insulated with the semiconductor layer, the source electrode, and the drain electrode by an insulating layer; and
    a transition layer sandwiched between the semiconductor layer and the insulating layer, wherein the transition layer is a silicon-oxide cross-linked polymer layer comprising a plurality of Si atoms, and the plurality of Si atoms is bonded with atoms of the insulating layer and atoms of the semiconductor layer.

2. The thin film transistor of claim 1, wherein a thickness of the transition layer ranges from about 5 nanometers to about 25 nanometers.

3. The thin film transistor of claim 1, wherein the carbon nanotube layer comprises a carbon nanotube film, and the carbon nanotube film comprises a plurality of single-wall carbon nanotubes joined by van der Waals attractive force.

4. The thin film transistor of claim 3, wherein the plurality of single-wall carbon nanotubes is disordered.

5. The thin film transistor of claim 1, wherein the carbon nanotube layer comprises a plurality of single-wall carbon nanotubes paralleled with each other.

6. The thin film transistor of claim 5, wherein a length of the plurality of single-wall carbon nanotubes is greater than 5 micrometers.

7. The thin film transistor of claim 6, wherein each of the plurality of single-wall carbon nanotubes comprises a first end and a second end opposite to the first end, the first end is electrically connected to the source electrode, and the second end is electrically connected to the drain electrode.

8. The thin film transistor of claim 5, wherein a distance between adjacent two single-wall carbon nanotubes ranges from about 0 micrometers to about 100 micrometers.

9. The thin film transistor of claim 5, wherein a diameter of the plurality of single-wall carbon nanotubes is about 5 nanometers, and a length of the plurality of single-wall carbon nanotubes is about 30 micrometers.

10. The thin film transistor of claim 1, wherein the silicon-oxide cross-linked polymer layer comprises a plurality of box-like units comprising a plurality of Si—O bonds and a plurality of Si—H bonds.

11. The thin film transistor of claim 1, wherein the source electrode and the drain electrode are Cs films, a thickness of the Cs film is about 5 nanometers, the gate electrode is Al film, and a thickness of the Al film is about 5 nanometers.

\* \* \* \* \*